United States Patent
Shen et al.

(10) Patent No.: US 11,479,874 B2
(45) Date of Patent: Oct. 25, 2022

(54) SEMICONDUCTOR CRYSTAL GROWTH APPARATUS

(71) Applicant: Zing Semiconductor Corporation, Shanghai (CN)

(72) Inventors: Weimin Shen, Shanghai (CN); Gang Wang, Shanghai (CN); Xianliang Deng, Shanghai (CN); Hanyi Huang, Shanghai (CN); Wee Teck Tan, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 0 days.

(21) Appl. No.: 16/904,564

(22) Filed: Jun. 18, 2020

(65) Prior Publication Data
US 2021/0010154 A1 Jan. 14, 2021

(30) Foreign Application Priority Data
Jun. 18, 2019 (CN) .......................... 201910527014.1

(51) Int. Cl.
*C30B 15/22* (2006.01)
*C30B 29/06* (2006.01)
*C30B 15/10* (2006.01)

(52) U.S. Cl.
CPC .............. *C30B 15/22* (2013.01); *C30B 15/10* (2013.01); *C30B 29/06* (2013.01)

(58) Field of Classification Search
CPC ......... C30B 15/10; C30B 15/14; C30B 15/22; C30B 29/06; C30B 30/04
See application file for complete search history.

(56) References Cited

U.S. PATENT DOCUMENTS

| 2005/0115493 A1* | 6/2005 | Radkevich | .............. C30B 15/30 117/200 |
| 2005/0257736 A1* | 11/2005 | Shimosaka | ............. C30B 15/14 117/217 |
| 2010/0288185 A1* | 11/2010 | Filar | ...................... C30B 29/06 117/217 |

FOREIGN PATENT DOCUMENTS

JP         2004182580 A  *  7/2004

* cited by examiner

*Primary Examiner* — Hua Qi
(74) *Attorney, Agent, or Firm* — Chen Yoshimura LLP (57) ABSTRACT

The invention provides a semiconductor crystal growth device comprising a furnace body; a crucible; a pulling device; a horizontal magnetic field applying device; and a deflector, being barrel-shaped and disposed above the silicon melt in the furnace body in a vertical direction, and the pulling device pulls the silicon ingot through the deflector in the vertical direction; wherein the bottom of the deflector has different thermal reflection coefficients at different positions, and the thermal reflection coefficient of the bottom of the deflector in the direction of the horizontal magnetic field is smaller than that in the direction perpendicular to the horizontal magnetic field. According to the semiconductor crystal growth device of the present invention, the temperature distribution inside the melt silicon and quality of the semiconductor crystal are improved.

8 Claims, 4 Drawing Sheets

SEMICONDUCTOR CRYSTAL GROWTH APPARATUS

CROSS-REFERENCE TO RELATED APPLICATIONS

This application claims priority to P.R.C. Patent Application No. 201910527014.1 titled "a semiconductor crystal growth apparatus" filed on Jun. 18, 2019, with the State Intellectual Property Office of the People's Republic of China (SIPO).

TECHNICAL FIELD

The present invention relates to the field of semiconductor technology, and in particular, to a semiconductor crystal growth device.

BACKGROUND

The Czochralski Process (Cz) method is an important method for preparing single crystal silicon for semiconductor and solar energy. The high-purity silicon material placed in the crucible is heated by a thermal field composed of a carbon material to melt it, and then the seed is melted by The crystal is immersed in the melt and undergoes a series of (introduction, shoulder, equal diameter, finishing, cooling) processes to obtain a single crystal rod.

In the growth of semiconductor single crystal silicon or solar single crystal silicon using the CZ method, the temperature distribution of the crystal and the melt directly affects the quality and growth rate of the crystal. During the growth of CZ crystals, due to the existence of thermal convection in the melt, the distribution of trace impurities is uneven and growth stripes are formed. Therefore, how to suppress the thermal convection and temperature fluctuation of the melt during the crystal pulling process has been a widespread concern.

The crystal growth technology under a magnetic field generator (called MCZ) applies a magnetic field to a silicon melt as a conductor, subjecting the melt to a Lorentz force opposite to its direction of movement, obstructing convection in the melt and increasing The viscosity of the melt reduces impurities such as oxygen, boron, and aluminum from the quartz crucible into the melt, and then into the crystal, so that the grown silicon crystal can have a controlled oxygen content from low to high range, reducing The impurity stripes are widely used in semiconductor crystal growth processes. A typical MCZ technology is so called horizontal magnetic field crystal growth (HMCZ) technology, which applies a horizontal magnetic field to a semiconductor melt, and is widely used for the growth of large-sized and demanding semiconductor crystals.

In the crystal growth technology under a horizontal magnetic field device (HMCZ), the crystal growth furnace, thermal field, crucible, and silicon crystals are as symmetrical as possible in the circumferential direction, and the crucible and crystal rotation make the temperature distribution in the circumferential direction tends to be uniform. However, the magnetic field lines of the magnetic field applied during the application of the magnetic field pass from one end of the silicon melt in the quartz crucible to the other end in parallel. The Lorentz force generated by the rotating silicon melt is different in all directions in the circumferential direction, so the silicon melt flow and temperature distribution are inconsistent in the circumferential direction.

Figure 1A:
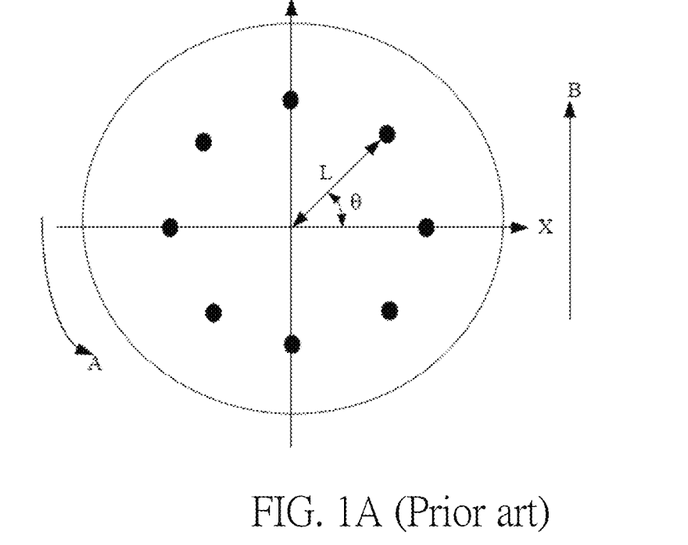
FIGS. 1A and 1B are schematic diagrams of the temperature distribution below the interface between a crystal and a melt in a semiconductor crystal growth apparatus.
Figure 1B:
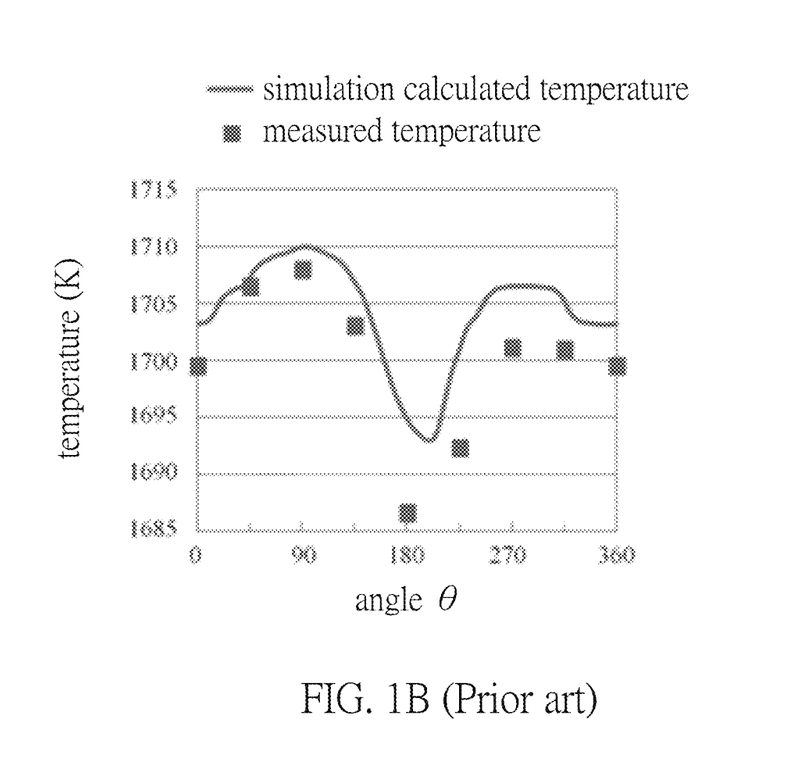

As shown in FIG. 1A and FIG. 1B, schematic diagrams of a temperature distribution below an interface between a crystal grown crystal and a melt in a semiconductor crystal growth apparatus are shown. Among them, FIG. 1A shows a graph of measured test points distributed on the horizontal surface of the silicon melt in the crucible, where one point is tested at an angle of $\theta=45°$ at a distance of 25 mm below the melt liquid level and a distance of L=250 mm from the center. FIG. 1B is a curve of the temperature distribution obtained by simulation calculation and test along each point at an angle $\theta$ with the X axis in FIG. 1A, where the solid line represents the temperature distribution map obtained by simulation calculation, and the dot diagram indicates the measured test method adopted distribution of temperature obtained. In FIG. 1A, the arrow A shows that the direction of rotation of the crucible is counterclockwise, and the arrow B shows that the direction of the magnetic field crosses the diameter of the crucible along the Y-axis direction. It can be seen from FIG. 1B that during the growth of the semiconductor crystal, both the results of the simulation calculation and the measured test method have shown that the temperature fluctuated on the circumference below the interface of a semiconductor crystal and the silicon melt liquid level changes with the angle during the growth of the semiconductor crystal.

According to the Voronkov crystal growth theory, the thermal equilibrium equation of the interface of the crystal and the liquid surface is as follows, $$PS*LQ=Kc*Gc-Km*Gm.$$

Among them, LQ is the potential of silicon melt to silicon crystal phase transition, Kc, Km represent the thermal conductivity of the crystal and the melt, respectively; Kc, Km, and LQ are the physical properties of the silicon material; PS represents the crystal crystallization speed along the on-pull elongation direction that is approximately the pulling speed of the crystal; Gc, Gm are the temperature gradient (dT/dZ) of the crystal and the melt at the interface, respectively. Because the temperature below the interface of the semiconductor crystal and the melt exhibits periodic fluctuations with the change of the circumferential angle during the growth of semiconductor crystals, that is, the Gc of the temperature gradient (dT/dZ) of the crystal and the melt as the interface, Gm fluctuates. Therefore, the crystallization speed PS of the crystal in the circumferential angle direction fluctuates periodically, which is not conducive to controlling the quality of crystal growth.

For the reasons above, it is necessary to propose a new semiconductor crystal growth device to solve the problems in the prior art.

SUMMARY

A series of simplified forms of concepts are introduced in the Summary of the Invention section, which will be described in further detail in the Detailed Description section. The summary of the invention is not intended to limit the key features and essential technical features of the claimed invention, and is not intended to limit the scope of protection of the claimed embodiments.

An objective of the present invention is to provide a semiconductor crystal growth apparatus, the semiconductor crystal growth apparatus comprises:

a furnace body;

a crucible being arranged inside the furnace body to contain a silicon melt;

a pulling device being arranged on the top of the furnace body and used for pulling out a silicon ingot from the silicon melt;

a horizontal magnetic field applying device for applying a horizontal magnetic field to the silicon melt in the crucible; and a deflector, being barrel-shaped and disposed above the silicon melt in the furnace body in a vertical direction, and the pulling device pulls the silicon ingot through the deflector in the vertical direction;

wherein the bottom of the deflector has different thermal reflection coefficients at different positions, and the thermal reflection coefficient of the bottom of the deflector in the direction of the horizontal magnetic field is smaller than that in the direction perpendicular to the horizontal magnetic field.

In accordance with some embodiments, the bottom of the deflector comprises a material layer having different thermal reflection coefficients at different positions by surface treatment.

In accordance with some embodiments, the bottom of the deflector comprises a first portion, a second portion, a third portion, and a fourth portion having the same area, and wherein:

the first portion and the third portion are oppositely disposed in a direction perpendicular to the horizontal magnetic field, and the second portion and the fourth portion are oppositely disposed in a direction of the horizontal magnetic field, the thermal reflection coefficients of the first and third portions are greater than the thermal reflection coefficients of the second and fourth portions.

In accordance with some embodiments, the deflector comprises a tuning device for tuning a thermal reflection coefficient at the bottom of the deflector.

In accordance with some embodiments, the deflector comprises an inner wall, an outer wall, and a heat insulating material, wherein the bottom of the outer wall extended below the bottom of the inner wall and is closed to the bottom of the inner wall to form a cavity between the inner wall and the outer wall, and the heat insulation material is disposed in the cavity;

wherein the tuning device comprises an inserting member, the inserting member comprises a protruding portion and an inserting portion, and the inserting portion is inserted between a portion of the bottom of the outer wall extended below the bottom of the inner wall and the bottom of the inner wall, and the protrusion portion at least partly covered the bottom of the outer wall.

In accordance with some embodiments, the protrusion portion partly covered the bottom of the outer wall, and the tuning device comprises at least two inserting members.

In accordance with some embodiments, the tuning device comprises two identical inserting members disposed oppositely to each other in the horizontal magnetic field direction, and a thermal reflection coefficient of the protrusion portion of the inserting member is smaller than a thermal reflection coefficient of the bottom of the outer wall; or, the tuning device comprises two identical inserting members disposed oppositely to each other in a direction perpendicular to the horizontal magnetic field, and a thermal reflection coefficient of the protrusion portion of the inserting members is larger than a thermal reflection coefficient of the bottom of the outer wall.

In accordance with some embodiments, the tuning device comprises a first inserting member, a second inserting member, a third inserting member, and a fourth inserting member, wherein the first inserting member, the second inserting member, the third inserting member, and the fourth inserting member each has a protrusion portion with the same area, and the first inserting member and the third inserting member are oppositely disposed in a direction perpendicular to the horizontal magnetic field, the second inserting member and the fourth inserting member are oppositely disposed in the direction of the horizontal magnetic field, and the first reflection member and the third inserting members have a thermal reflection coefficient greater than that of the second inserting member and the fourth inserting member.

In accordance with some embodiments, the protruding portions of the first inserting member, the second inserting member, the third inserting member and the fourth inserting member are assembled together to fully cover the bottom of the outer wall after the inserting portions of the first inserting member, the second inserting member, the third inserting member and the fourth inserting member are inserted into the places between a portion of the bottom of the outer wall extended below the bottom of the inner wall, and the bottom of the inner wall.

In accordance with some embodiments, the protrusion portions of the inserting members are arranged as an oval ring to fully cover the bottom of the outer wall.

According to the semiconductor crystal growth apparatus of the present invention, by setting different positions of the bottom of the deflector to have different thermal reflection coefficients, the thermal reflection coefficient of the bottom of the deflector in the horizontal magnetic field direction is smaller than that in the direction perpendicular to the horizontal magnetic field, thereby regulating the temperature distribution of the silicon melt below the silicon rod and the silicon melt interface, so that the semiconductor crystal growth can be tuned. During the growth process, the fluctuation of the temperature distribution of the silicon melt below the liquid crystal interface of the semiconductor crystal and the silicon melt caused by the applied horizontal magnetic field effectively improves the uniformity of the silicon melt temperature distribution, thereby improving the crystal growth uniformity as well as the quality of the pulling crystal. At the same time, the flow structure of the silicon melt is also tuned to make the flow state of the silicon melt more uniform along the circumferential direction, which further improves the uniformity of the speed of crystal growth and reduces the defects of crystal growth.

BRIEF DESCRIPTION OF THE DRAWINGS

Exemplary embodiments will be more readily understood from the following detailed description when read in conjunction with the appended drawings, in which.

DETAILED DESCRIPTION

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

In the following description, while the invention will be described in conjunction with various embodiments, it will be understood that these various embodiments are not intended to limit the invention. On the contrary, the invention is intended to cover alternatives, modifications and equivalents, which may be comprised within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

To understand the invention thoroughly, the following descriptions will provide detail steps to explain a method for crystal growth control of a shouldering process according to the invention. It is apparent that the practice of the invention is not limited to the specific details familiar to those skilled in the semiconductor arts. The preferred embodiment is described as follows. However, the invention has further embodiments beyond the detailed description.

The terminology used herein is for the purpose of describing particular embodiments only and is not intended to be limiting of example embodiments. As used herein, the singular forms "a," "an" and "the" are intended to comprise the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Figure 2:
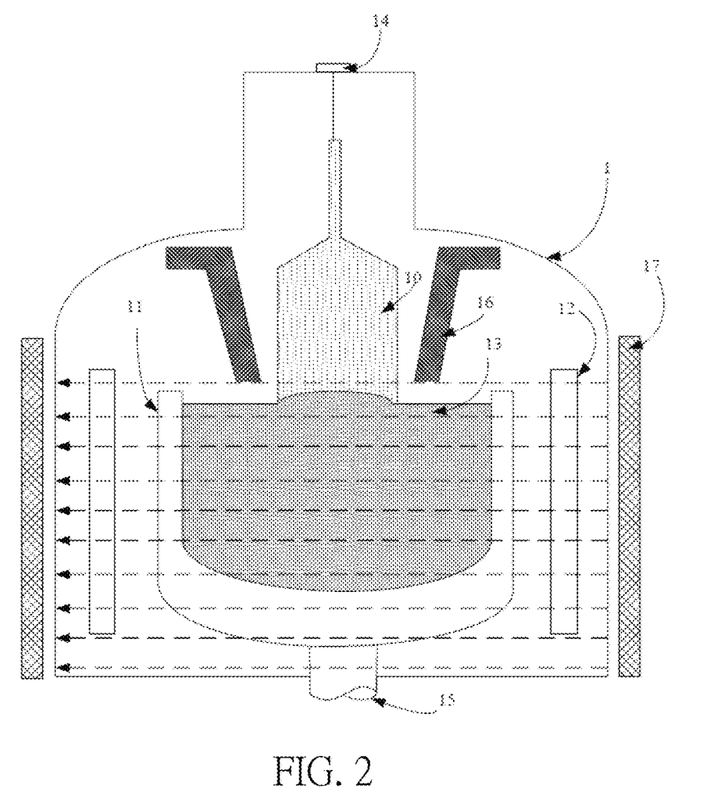
FIG. 2 is a schematic structural diagram of a semiconductor crystal growth apparatus according to the present invention.

Referring to FIG. 2, a schematic structural diagram of a semiconductor crystal growth device according to one embodiment of the present invention is shown. The semiconductor crystal growth device includes a furnace body 1, a crucible 11 is disposed in the furnace body 1, and a heater 12 is provided on the outer side of the crucible 11 for heating. The crucible 11 contain a silicon melt 13. The crucible 11 is composed of a graphite crucible and a quartz crucible sheathed in the graphite crucible. The graphite crucible receives the heat provided by the heater to melt the polycrystalline silicon material in the quartz crucible to form a silicon melt. Each quartz crucible is used for a batch semiconductor growth process, and each graphite crucible is used for a multi-batch semiconductor growth process.

A pulling device 14 is provided on the top of the furnace body 1. Driven by the pulling device 14, a seed crystal may be pulled and pulled out of a silicon ingot 10 from the liquid level of the silicon melt, and a heat shield device is provided around the silicon ingot 10. The heat shield device, for example, as shown in FIG. 1, comprises a deflector 16, which is provided in a barrel type, serves as a heat shield device to isolate the quartz crucible during the crystal growth process and the thermal radiation generated by the silicon melt in the crucible on the surface of the crystal increases the cooling rate and axial temperature gradient of the ingot, and increases the number of crystal growth. On the other hand, it affects the thermal field distribution on the surface of the silicon melt and avoids the axial temperature gradient between the center and the edge is too large to ensure stable growth between the crystal ingot and the liquid level of the silicon melt. At the same time, the baffle is also used to guide the inert gas introduced from the upper part of the crystal growth furnace to make it a large flow rate passes through the surface of the silicon melt to achieve the effect of controlling the oxygen content and impurity content in the crystal. During the growth of the semiconductor crystal, driven by the pulling device 14, the silicon ingot 10 passes vertically through the deflector 16.

In order to achieve stable growth of the silicon ingot, a driving device 15 for driving the crucible 11 to rotate and move up and down is provided at the bottom of the furnace body 1. The driving device 15 drives the crucible 11 to keep rotating during the crystal pulling process in order to reduce silicon melting. The thermal asymmetry of the body causes the silicon crystal columns to grow equally.

In order to hinder the convection of the silicon melt, increase the viscosity in the silicon melt, reduce impurities such as oxygen, boron, and aluminum from the quartz crucible into the melt and then into the crystal, so that the grown silicon crystal can have the controlled low-to-high range oxygen content reduces impurity streaks. The semiconductor growth device further comprises a horizontal magnetic field applying device 17 located outside the furnace body 1 to apply a horizontal magnetic field to the silicon melt in the crucible.

Since the magnetic field lines of the horizontal magnetic field applied by the horizontal magnetic field applying device 17 pass from one end of the silicon melt in the crucible to the other end in parallel (see the dotted arrow in FIG. 2), the Lorentz force generated by the rotating silicon melt is on the circumference. The directions are different, so the flow and temperature distribution of the silicon melt are inconsistent in the circumferential direction, where the temperature along the direction of the magnetic field is higher than that in the direction perpendicular to the magnetic field. The inconsistency of the flow and temperature of the silicon melt manifests as the temperature of the melt below the interface of the semiconductor crystal and the melt fluctuates with the change of the angle, so that the crystallization speed PS of the crystal fluctuates, so that the semiconductor growth speed appears inconsistent on the circumference. Such non-uniformity is not suited for the quality control of semiconductor crystal growth.

For this reason, in the semiconductor growth device of the present invention, the deflector 16 is arranged so that the bottom part has different thermal reflection coefficients at different positions, so that the silicon melt is radiated to the bottom of the deflector at different positions on the bottom of the deflector, as well as reflected back to the silicon melt from the bottom of the deflector with different heat. Parts with low thermal reflection coefficients absorb more radiant energy and emit less energy. They can absorb as much heat as possible from the surface of the nearest object (radiation).

Specifically, a thermal reflection coefficient of the bottom of the deflector in the direction of the horizontal magnetic field is smaller than a thermal reflection coefficient of the bottom of the deflector in a direction perpendicular to the horizontal magnetic field. Where the thermal reflection coefficient is large, the heat radiated from the liquid surface of the silicon melt to the deflector is small; on the other hand, where the thermal reflection coefficient is small, the heat radiated from the liquid surface of the silicon melt to the deflector is large. Therefore, the temperature of the liquid surface of the silicon melt in the place where the thermal reflection coefficient is large is reduced less than the temperature of the liquid surface of the silicon melt in the place where the thermal reflection coefficient is small, which compensates for the effect of the horizontal magnetic field on the flow of the silicon melt. The effect is that the temperature in the direction of the horizontal magnetic field is higher than the temperature perpendicular to the direction in which the magnetic field is applied. According to this, by setting the distance between the bottom of the deflector and the silicon crystal ingot, the temperature distribution of the silicon melt below the interface between the silicon ingot and the silicon melt can be tuned, so that it can be tuned due to the horizontal magnetic field applied. The fluctuation of the temperature distribution of the silicon melt effectively improves the uniformity of the temperature distribution of the liquid level of the silicon melt, thereby improving the uniformity of the speed of crystal growth and the quality of crystal pulling.

At the same time, because the internal temperature distribution of the silicon melt is more uniform, this further improves the uniformity of the crystal growth rate, makes the oxygen content distribution in the growing semiconductor crystal uniform, and improves the uniformity of the oxygen content distribution in the crystal in order to reduce defects in crystal growth.

According to an example of the present invention, the bottom of the deflector is provided as material layers with different thermal reflection coefficients formed at different positions by surface treatment. Exemplarily, the surface treatment comprises chemical vapor deposition (CVD), physical vapor deposition (PVD), or coating. Surface treatment is used to form the bottom of the deflector with different thermal reflection coefficients at different positions. It does not need to change the structure and settings of the existing deflector, and it does not affect the position and method of each component in the semiconductor growth device. Therefore, the semiconductor crystal growth device of the present invention is simple and efficient.

In one embodiment, the bottom of the deflector includes a first portion, a second portion, a third portion, and a fourth portion having the same area, wherein the first portion and the third portion are perpendicular to the horizontal magnetic field, while the second portion and the fourth portion are oppositely arranged in the direction of the magnetic field, and the first portion and the third portion have thermal reflection coefficients larger than those of the second portion and the third portion.

Figure 3:
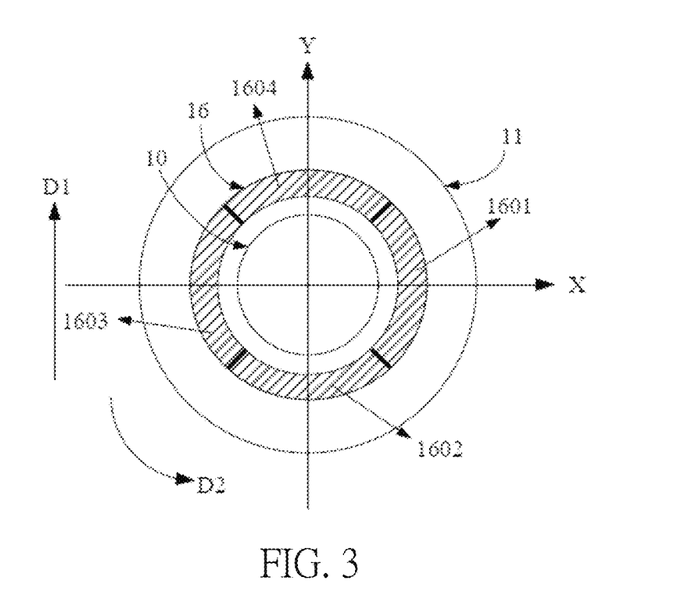
FIG. 3 is a schematic cross-sectional positional arrangement of a crucible, a deflector, and a silicon crystal rod in a semiconductor crystal growth apparatus according to an embodiment of the present invention.

Referring to FIG. 3, a schematic cross-sectional positional arrangement of a crucible, a deflector, and a silicon ingot in a semiconductor crystal growth apparatus according to an embodiment of the present invention is shown. As shown in FIG. 3, in a plan view, the cross sections of the crucible 11, the deflector 16 and the silicon ingot 10 are arranged concentrically. The bottom of the deflector 16 includes a first portion 1601, a second portion 1602 and a third portion 1603, and a fourth portion 1604. Arrow D1 is shown as the direction of the horizontal magnetic field, and arrow D2 is shown as the direction in which the crucible 11 is rotated. The first portion 1601 and the third portion 1603 are oppositely disposed in a direction perpendicular to the horizontal magnetic field, and the second portion 1602 and the fourth portion 1604 are relatively disposed in a direction along the horizontal magnetic field. The thermal reflection coefficients of the first portion 1601 and the third portion 1603 are greater than the thermal reflection coefficients of the second portion 1602 and the fourth portion 1604.

It should be understood that, in this embodiment, setting a first portion 1601, a second portion 1602, a third portion 1603, and a fourth portion 1604 to have the same area is only exemplary, and those skilled in the art should understand that as long as the thermal reflection coefficient at the bottom of the deflector in the direction of the horizontal magnetic field is smaller than the thermal reflection coefficient at the bottom of the deflector in the direction perpendicular to the horizontal magnetic field, any area distribution can improve the semiconductor crystal growth process and achieve the technical effect of silicon melt temperature distribution under the interface between semiconductor crystal and silicon melt.

According to an embodiment of the present invention, the deflector comprises a tuning device for tuning the thermal reflection coefficient at the bottom of the deflector. The thermal reflection coefficient at the bottom of the deflector can be changed by adding a tuning device, which can simplify the manufacturing process of the deflector on the existing deflector structure. At the same time, according to the needs of different growth processes, only different tuning devices need to be prepared, without the need to modify the entire deflector, the method is simple, and the tuning device can be modularized manufacturing.

Exemplarily, the deflector comprises an inner wall, an outer wall, and a heat insulating material, wherein the bottom of the outer wall extended below the bottom of the inner wall and is closed to the bottom of the inner wall to form a cavity between the inner wall and the outer wall, and the heat insulation material is disposed in the cavity.

According to an embodiment of the present invention, the tuning device comprises an inserting member, the inserting member comprises a protruding portion and an inserting portion, and the inserting portion is inserted between a portion of the bottom of the outer wall extended below the bottom of the inner wall, and the bottom of the inner wall, and the protruding portion at least partially covers the bottom of the outer wall. As the existing deflector is generally set as a conical barrel, the bottom of the deflector is usually set to have a circular cross-section. By setting the deflector as an inserting member between the inner wall and the outer wall, the shape of the bottom of the deflector can be flexibly tuned by tuning the structure and shape of the inserting member without changing the structure of the existing deflector. So that the temperature of the silicon melt liquid level can be tuned by the reflection coefficient and the flow rate of argon gas flowing from the deflector to the silicon melt liquid level can also be tuned to affect the shear force of the silicon melt liquid level. Therefore, the flow structure of the silicon melt is tuned, so that the flow state and temperature distribution of the silicon melt are more uniform, and the uniformity of the speed of crystal growth is further improved, and the quality of the crystal pulling is improved. At the same time, the inserted components can be manufactured and replaced in a modular manner, which can be adapted to a variety of semiconductor crystal growth processes under different conditions, thereby saving costs.

Figure 4:
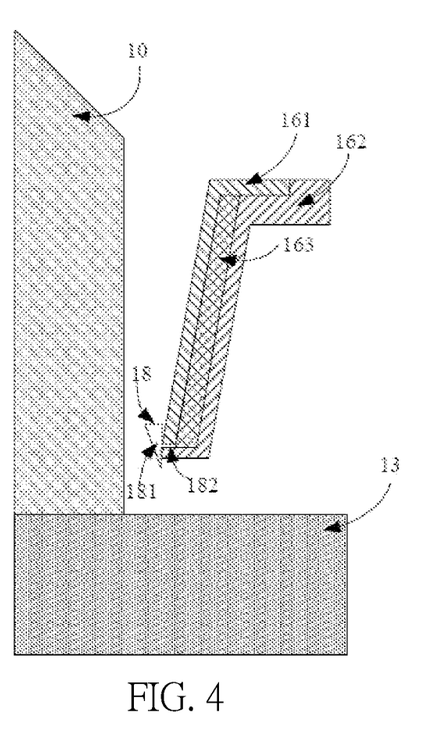
FIG. 4 is a schematic structural diagram of a deflector in a semiconductor growth apparatus according to an embodiment of the present invention.

Referring to FIG. 4, there is shown a schematic structural diagram of a deflector in a semiconductor growth apparatus according to an embodiment of the present invention. Referring to FIG. 4, the deflector 16 comprises an inner wall 161, an outer wall 162, and a heat insulating material 163 disposed between the inner wall 161 and the outer wall 162, wherein a bottom of the outer wall 162 extended below the bottom of the inner wall 161 and it is closed with the bottom of the inner wall 161 to form a cavity for containing the heat insulation material 163 between the inner wall 161 and the outer wall 162. Setting the deflector into a structure including an inner wall, an outer wall, and a heat insulating material can simplify the installation of the deflector. Exemplarily, the material of the inner wall and the outer wall is set to graphite, and the heat insulation material may comprise glass fiber, asbestos, rock wool, silicate, aerogel felt, vacuum plate, and the like.

With continued reference to FIG. 4, a tuning device 18 is provided at the lower end of the deflector 16. The tuning device 18 comprises a protruding portion 181 and an inserting portion 182 which are provided to be inserted between a portion of the bottom of the outer wall 162 extended below the bottom of the inner wall 161, and the bottom of the inner wall 161. The tuning device is installed on the deflector in the form of an insert, without the need to modify the deflector, the installation of the tuning device can be realized, and the manufacturing and installation costs of the tuning device and the deflector are further simplified. At the same time, the position where the inserting portion is inserted between the bottom of the outer wall and the bottom of the inner wall effectively reduces the heat conduction from the outer wall to the inner wall, reduces the temperature of the inner wall, and further reduces the radiant heat transfer from the inner wall to the ingot, effectively. The difference between the axial temperature gradient of the center and the periphery of the silicon ingot is reduced, and the quality of the crystal pulling is improved. Exemplarily, the tuning device is employed a material with low thermal conductivity, such as SiC ceramic, quartz, or the like.

Exemplarily, the tuning device may be provided in sections.

Figure 5A:
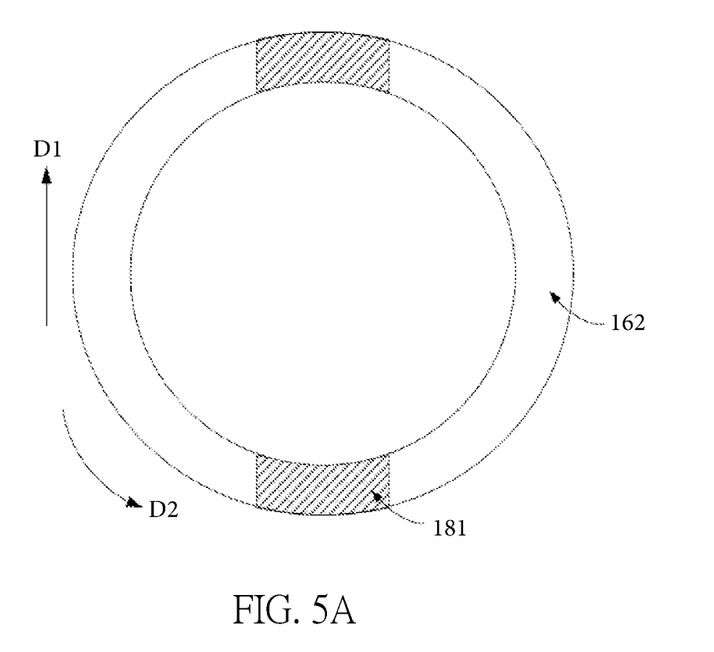
FIG. 5A is a schematic bottom view of a semiconductor crystal growth apparatus according to an embodiment of the present invention after an inserting member is provided in a deflector.

In one embodiment, the protruding portion partially covers the bottom of the outer wall, and the tuning device comprises at least two inserting members. Referring to FIG. 5A, a schematic bottom view of a deflector including two inserting members is shown. Among them, the outer wall 162 of the deflector covers the protruding portion 181 of the inserting member. As previously explained in FIG. 3, the arrow D1 shows the direction of the horizontal magnetic field, and the arrow D2 shows the direction in which the crucible 11 rotates. The inserting members serving as the tuning device are oppositely inserted at both ends in the horizontal magnetic field application direction, so that the protrusions 181 of the inserting member cover the bottom of the outer wall of the deflector in the horizontal magnetic field application direction. The thermal reflection coefficient of the protruding portion 181 of the inserting member is smaller than the reflection coefficient of the bottom of the outer tube 162. It should be understood that the relative arrangement of the inserting member in the direction of the horizontal magnetic field in this embodiment is merely exemplary, and those skilled in the art will understand that two identical inserting members that are oppositely disposed in the direction perpendicular to the horizontal magnetic field, the thermal reflection coefficient of the protruding portion of the inserting member is larger than the thermal reflection coefficient of the bottom of the outer wall, that is also applicable to the present invention.

Figure 5B:
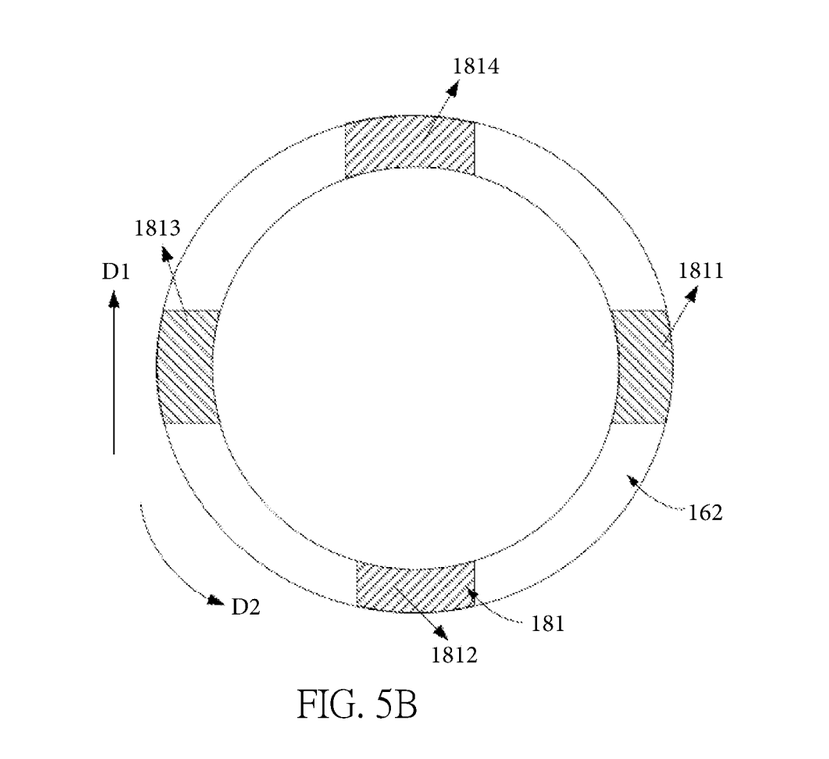
FIG. 5B is a schematic bottom view of a semiconductor crystal growth apparatus according to another embodiment of the present invention, after the inserting member is disposed in the deflector.

Exemplarily, the tuning device includes a first inserting member, a second inserting member, a third inserting member, and a fourth inserting member, wherein the first inserting member, the second inserting member, the third inserting member and the fourth inserting member each has the protrusions having the same area, the first inserting member and the third inserting member are oppositely disposed in a direction perpendicular to the horizontal magnetic field, and the second inserting member and the fourth inserting member are oppositely disposed in the direction of the horizontal magnetic field, and the thermal reflection coefficients of the first inserting member and the third inserting member are higher than the thermal reflection coefficients of the second inserting member and the fourth inserting member. As shown in FIG. 5B, a schematic bottom view of a deflector including four inserting members is shown. Among them, the inserting member includes a first inserting member 1811, a second inserting member 1812, a third inserting member 1813, and a fourth inserting member 1814. As previously explained in FIG. 3, the arrow D1 shows the direction of the horizontal magnetic field, and the arrow D2 shows the direction of the crucible 11 rotation. The first inserting member 1811 and the third inserting member 1813 are opposite to each other in a direction perpendicular to the magnetic field, and the second inserting member 1812 and the fourth inserting member 1814 are opposite to each other in a magnetic field direction. Wherein the thermal reflectivity of the protrusion of the first inserting member 1811 and the third inserting member 1813 is larger than that of the second inserting member 1812 and the fourth inserting member 1814.

It should be understood that, in this embodiment, setting the first inserting member 1811, the second inserting member 1812, the third inserting member 1813, and the fourth inserting member 1814 to partially cover the bottom of the outer wall 162 is merely exemplary. In other applications, the first inserting member 1811, the second inserting member 1812, the third inserting member 1813, and the fourth inserting member 1814 can be combined to cover the bottom of the outer wall completely, as in the case of the four portions in FIG. 3, so it will not provide more details here.

At the same time, it should be understood that, in this embodiment, the inserting member is configured to include a first inserting member 1811, a second inserting member 1812, a third inserting member 1813, and a fourth inserting member 1814. The thermal reflectivity of the protrusions of first inserting member 1811 and the first inserting member 1811 is greater than that of the second inserting member 1812 and the fourth inserting member 1814 also just merely exemplary, and those skilled in the art will understand that any number of inserting members and the protrusions of the inserting members, or the settings are identical or different, as long as the thermal reflection coefficient at the bottom of the deflector in the horizontal magnetic field direction is smaller than the thermal reflection coefficient at the bottom of the deflector in the horizontal magnetic field direction, can achieve the technical effects of the present invention.

According to an embodiment of the present invention, the protruding portion of the inserting member is provided in a ring shape so as to completely cover the bottom of the outer wall. The technical effect of the present invention can also be achieved by forming materials with different thermal reflection coefficients on the protrusions that comprehensively cover the bottom of the outer wall.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A semiconductor crystal growth apparatus, comprising:
   a furnace body;
   a crucible being arranged inside the furnace body to contain a silicon melt; and
   a deflector, being barrel-shaped and disposed above the silicon melt in the furnace body in a vertical direction;
   wherein a horizontal magnetic field is provided to the silicon melt in the crucible and a silicon ingot is pulled from the silicon melt through the deflector in the vertical direction;
   wherein the semiconductor crystal growth apparatus is characterized that a bottom of the deflector comprises a first portion, a second portion, a third portion, and a fourth portion, the first portion and the third portion are oppositely disposed in a direction perpendicular to the horizontal magnetic field, and the second portion and the fourth portion are oppositely disposed in a direction of the horizontal magnetic field, a thermal reflection coefficients of the first and third portions are greater than a thermal reflection coefficients of the second and fourth portions to make the thermal reflection coefficient of the bottom of the deflector in the direction of the horizontal magnetic field is smaller than that in a direction perpendicular to the horizontal magnetic field.

2. The apparatus according to claim 1, wherein the first portion, the second portion, the third portion, and the fourth portion has the same area.

3. The apparatus according to claim 1, wherein the deflector comprises an inner wall, an outer wall, and a heat insulating material, wherein the bottom of the outer wall extended below the bottom of the inner wall and is closed to the bottom of the inner wall to form a cavity between the inner wall and the outer wall, and the heat insulation material is disposed in the cavity.

4. The apparatus according to claim 3, wherein the deflector further comprises;
   an inserting member comprising, a protruding portion and an inserting portion, and wherein the inserting portion is inserted between a portion of the bottom of the outer wall extended below the bottom of the inner wall and the bottom of the inner wall, and the protrusion portion at least partly covers the bottom of the outer wall.

5. The apparatus according to claim 4, wherein the deflector comprises at least two inserting members, and the inserting member comprises the protrusion portion partly covering the bottom of the outer wall.

6. The apparatus according to claim 5, wherein
   the deflector comprises two identical inserting members disposed oppositely to each other in the horizontal magnetic field direction, the two identical inserting members at least partly cover the second portion and the fourth portion of the bottom of the deflector, respectively, and a thermal reflection coefficient of the protrusion portion of the inserting member is smaller than a thermal reflection coefficient of the bottom of the outer wall; or,
   the deflector comprises two identical inserting members disposed oppositely to each other in a direction perpendicular to the horizontal magnetic field, the two identical inserting members at least partly cover the first portion and the third portion of the bottom of the deflector, respectively, and a thermal reflection coefficient of the protrusion portion of the inserting members is larger than a thermal reflection coefficient of the bottom of the outer wall.

7. The apparatus according to claim 5, wherein the deflector comprises a first inserting member, a second inserting member, a third inserting member, and a fourth inserting member,
   wherein the first inserting member, the second inserting member, the third inserting member, and the fourth inserting member each has a protrusion portion with the same area, and
   the first inserting member and the third inserting member are oppositely disposed in a direction perpendicular to the horizontal magnetic field and at least partly cover the first portion and the third portion of the bottom of the deflector, respectively,
   the second inserting member and the fourth inserting member are oppositely disposed in the direction of the horizontal magnetic field and at least partly cover the second portion and the fourth portion of the bottom of the deflector, respectively, and
   the first reflection member and the third inserting members have a thermal reflection coefficient greater than that of the second inserting member and the fourth inserting member.

8. The apparatus according to claim 7, wherein protruding portions of the first inserting member, the second inserting member, the third inserting member and the fourth inserting member are assembly together to at least partly cover the bottom of the outer wall after the inserting portions of the first inserting member, the second inserting member, the third inserting member and the fourth inserting member are inserted into places between a portion of the bottom of the outer wall extended below the bottom of the inner wall, and the bottom of the inner wall.

* * * * *